United States Patent [19]

Numata et al.

[11] 4,315,221
[45] Feb. 9, 1982

[54] SWITCHING CIRCUIT

[75] Inventors: Tatsuo Numata; Kohji Ishida, both of Tokyo, Japan

[73] Assignee: Pioneer Electronic Corporation, Tokyo, Japan

[21] Appl. No.: 78,621

[22] Filed: Sep. 25, 1979

[30] Foreign Application Priority Data

Sep. 27, 1978 [JP] Japan .................. 53-118816

[51] Int. Cl.³ .................. H03F 3/30; H03G 3/34
[52] U.S. Cl. .................. 330/51; 330/267; 330/279
[58] Field of Search .................. 330/51, 267, 273, 278, 330/279, 285, 288, 296, 297, 298; 455/222, 223, 224

[56] References Cited

U.S. PATENT DOCUMENTS 3,896,393  7/1975  Cave et al. .................. 330/298 X Primary Examiner—James B. Mullins
Attorney, Agent, or Firm—Sughrue, Mion, Zinn, Macpeak & Seas

[57] ABSTRACT

A muting switching circuit for decoupling the output signal from an FM tuner including a transistor PNP-NPN pair push-pull connected between the terminals of a power source with a current mirror circuit supplying bias to the transistor pair in response to an input muting control signal. A middle point potential equal to one-half the voltage of the power source supplying current to the circuit is connected to a common connection point of the transistor pair so that when the transistors are rendered nonconductive by control of the input control signal, the common connection point thereof, which is also the output terminal of the circuit, is brought to the middle point potential immediately so that no pop noise is produced in the output signal. Preferably, a capacitor is coupled between the source of the middle point potential and ground to slow down transitions in the output signal when the power source is switched off or on to thereby prevent pop noise in the output signal at that time.

6 Claims, 3 Drawing Figures

SWITCHING CIRCUIT

DESCRIPTION OF THE PRIOR ART

The invention relates to a switching circuit employed as a muting device in an FM stereophonic tuner or the like. The invention is intended to provide a muting device which eliminates the so-called "pop noise" which may be generated at the time of muting switching and to control DC variations in the tuner output signal which may be present at the time of a muting switching operation. The output signal desirably has a high S/N ratio and is low in total harmonic distortion (THD).

A conventional FM tuner muting circuit employs a relay. However, use of a relay in such an application involves problems in that it is relatively expensive and has low reliability because the contacts thereof are liable to become fouled.

In order to solve this problem, a muting circuit utilizing an electronic circuit has been previously proposed. However, such a muting circuit is still disadvantageous in that it does nothing to improve the S/N ratio and the total harmonic distortion of the tuner.

In order to overcome this difficulty, it has been proposed that negative feedback be applied to the switching circuit itself. However, use of negative feedback with any of the conventional circuits described above is disadvantageous in that the resulting circuit is quite complex and a large pop noise is still caused when the power source is turned on or off because the aforementioned negative feedback action is then not in operation.

Accordingly, an object of this invention is to provide a switching circuit which ameliorates signal distortion and improves the S/N ratio while eliminating pop noise generation which are the disadvantages of a muting circuit employing a prior art electronic switching circuit.

It is also an object of the invention to provide such a circuit which prevents generation of pop noises at the time of power source switching.

SUMMARY OF THE INVENTION

These, as well as other objects of the invention, may be met by a muting circuit constructed with a single-ended push-pull circuit in which the emitters of a PNP transistor and an NPN transistor are commonly connected with the same signal applied to the bases of the two transistors with an output provided at the commonly-connected emitters of the transistors. A switching circuit is connected thereto in which a bias current is applied to the aforesaid two transistors with the bias current turned on and off by a current mirror circuit. A resistor is connected between the commonly connected emitters providing thereto a source of a middle point potential so that when the two transistors are rendered non-conductive, the potential of the commonly-connected emitters of the two transistors is made equal to the middle point potential. By middle point potential is intended a voltage which is substantially one-half that of a power source to which the switching circuit is connected for supplying thereto operating power. There may further be included a capacitor coupled between the source of the middle point potential and ground for slowing the rise and fall of the output signal from the push-pull circuit when the power source is switched on and off.

Further, objects of the invention can be met by providing a muting switching circuit including the combination of a transistor pair connected in a push-pull arrangement between two terminals of a power source, a current mirror circuit for supplying bias to the transistor pair in response to an input control signal coupled thereto, means for supplying a middle point potential relative to the power source to a common connection point of the transistor pair and means for supplying at least portions of an input signal to an input control electrode of each of the transistor pair.

Yet more specifically, a building switching circuit in accordance with the invention includes a first NPN transistor having its collector coupled to a positive terminal of a DC power source, a first PNP transistor having its emitter coupled to the emitter of the first NPN transistor and its collector coupled to a ground terminal of the power source, first and second diodes coupled in series with one another with the anode of the first diode coupled to the base of the first PNP transistor, a second PNP transistor having its emitter coupled through a first resistor to the positive terminal of the power source and with its collector coupled to the base of the first NPN transistor, a third PNP transistor having its base coupled to the base of the second PNP transistor with its emitter coupled through a second resistor to the positive terminal, a fourth PNP transistor having its emitter coupled to the interconnected bases of the second and third transistors with its collector coupled to ground, that is the ground terminal of the power source, and its base coupled to the collector of the third PNP transistor, a second NPN transistor having its collector coupled to the base of the first NPN transistor and its emitter coupled to ground through a third resistor, a third NPN transistor having its base coupled to the base of the second NPN transistor, its collector coupled to the collector of the third PNP transistor and its emitter coupled to ground through a fourth resistor wherein the interconnected bases of the second and third NPN transistors form a control signal input terminal, fifth and sixth resistors coupled in series with one another between the positive terminal and ground with fifth and sixth resistors having substantially the same resistance values, a seventh resistor having one terminal coupled to the common connection point of the fifth and sixth resistors and a second terminal coupled to the interconnected emitters of the first NPN transistor and first PNP transistor, and a capacitor coupled between the common connection point of the fifth and sixth resistors and ground. There may further be provided means for coupling the input signal to the common connection point of the first and second diodes.

DESCRIPTION OF THE PREFERRED EMBODIMENT OF THE INVENTION

Figure 1:
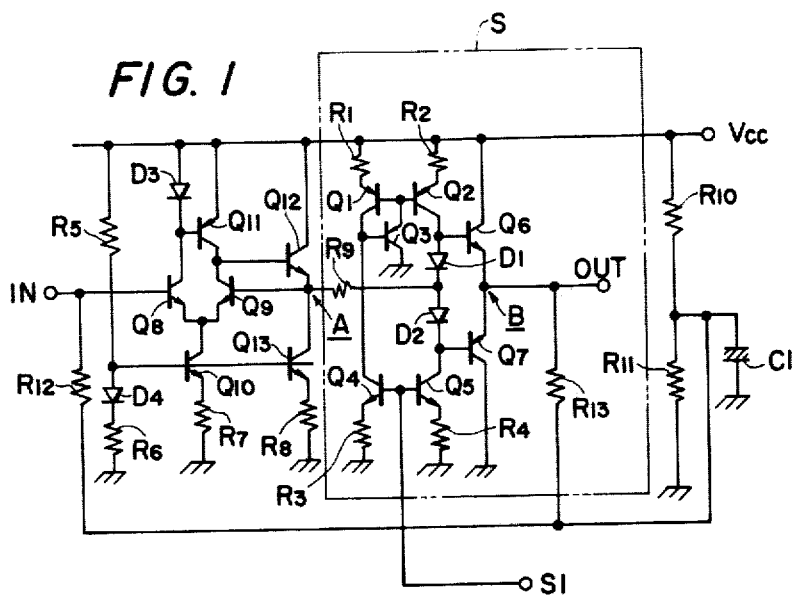
FIG. 1 is a circuit diagram of one embodiment of the invention.

One embodiment of the invention will be described with reference to the accompanying drawings. In FIG. 1, a switching circuit according to the invention is indicated by a block S surrounded by the broken line. In the switching circuit, a current mirror circuit includes transistors Q1–Q5 and resistors R1–R4, and a single-ended push-pull (hereinafter referred to merely as "SEPP") voltage follower circuit is formed by diodes D1 and D2 and transistors Q6 and Q7.

In the current mirror circuit, the emitter of the transistor Q1 is connected through the resistor R1 to the positive terminal of the power source and the base thereof is connected to the base of the transistor Q2. The emitter of the transistor Q2 is connected through the resistor R2 to the positive terminal of the power source. The common connection point of the bases of the transistors Q1 and Q2 is connected to the emitter of the transistor Q3. The base of the transistor Q3 is connected to the collector of the transistor Q1 and the collector of the transistor Q3 is grounded. The collector of the transistor Q1 is connected to the collector of the transistor Q4 and the collector of the transistor Q2 is connected through the diodes D1 and D2 to the collector of the transistor Q5. The emitters of the transistors Q4 and Q5 are grounded through the resistors R3 and R4, respectively. The bases of the transistors Q4 and Q5 are connected together and further connected to a control signal input terminal SI.

In the SEPP voltage follower circuit, the collector of the NPN-type transistor Q6 is connected to the DC positive source and the base is connected to the collector of the transistor Q2. The emitter of the PNP type transistor Q7 is connected to the emitter of the NPN-type transistor Q6 and the collector of the transistor Q7 is grounded. The base of the transistor Q7 is connected to the collector of the transistor Q5. The diodes D1 and D2 are series-connected between the bases of the two transistors Q6 and Q7 thus forming a bias circuit. The common connection point of the emitters of the transistors Q6 and Q7 is connected to an output terminal OUT.

A well-known type buffer amplifier circuit is constituted by transistors Q8–Q13, diodes D3 and D4 and resistors R5–R8. The base of the transistor Q8 is connected to a signal input terminal IN and the emitter of the transistor Q12 forms the signal output terminal of the buffer amplifier circuit. The signal output terminal of the buffer amplifier circuit is connected through a resistor R9 to the input terminal of the SEPP voltage follower circuit, that is the connection point of the diodes D1 and D2.

Voltage divider resistors R10 and R11 are series-connected between positive power source terminal and ground. The resistance values resistors R10 and R11 are substantially equal to one another. The common connection point of the two resistors R10 and R11 is grounded through a capacitor C1, and is further connected to the common connection point of resistors R12 and R13. The other end of the resistor R12 is connected to the signal input terminal IN of the buffer amplifier circuit. The other end of the resistor R13 is connected to the output terminal OUT of the SEPP voltage follower circuit.

In the circuitry thus organized, when a muting controlling DC positive voltage is applied to the control signal input terminal SI, the transistors Q4 and Q5 are rendered conductive as a result of which the current mirror circuit is operated to permit bias current to flow in the diodes D1 and D2 and transistors Q6 and Q7 so that the circuit operates as a SEPP type voltage follower circuit. Accordingly, the potential at the point B in FIG. 1 becomes equal to the potential at the point A and the signal applied to the input terminal IN is applied through the buffer amplifier circuit to the connection point of the diodes D1 and D2 and is further applied through the diodes D1 and D2 to the transistors Q6 and Q7 where it is amplified and coupled to the output terminal OUT. In this operation, the generation of harmonic distortion attributed to non-linearities in the base-emitter voltages $V_{BE}$ of the transistors is nullified as the two non-linearities cancel each other in the SEPP voltage follower circuit made up of the diodes D1 and D2 and the complementary transistors Q6 and Q7. Therefore, there is essentially no distortion in the output signal. In addition, the complementary transistors Q6 and Q7 perform a push-pull operation with half of the supply voltage as the operating center. Accordingly, the supply voltage utilization factor is excellent and accordingly the dynamic range can be increased.

When the DC voltage applied to the control signal input terminal SI is reduced to zero in response to the generation of the muting control signal, both of the transistors Q4 and Q5 are rendered nonconductive as a result of which the operation of the current mirror circuit is suspended and the current mirror circuit assumes a high impedance.

Figure 2:
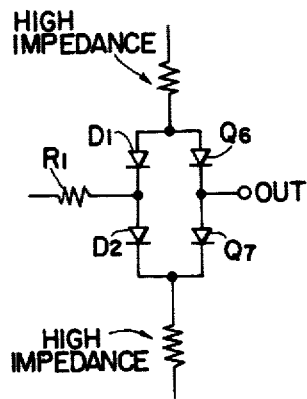
FIG. 2 is an equivalent circuit of a part of the circuit shown in FIG. 1.

The equivalent circuit of the SEPP circuit under this condition is as shown in FIG. 2. That is, as the diodes D1 and D2 and the base-emitter equivalent diodes of the transistors Q6 and Q7 are connected with back-to-back polarity as shown in FIG. 2, no current flows in or out and the output is placed in a floating state. In this case, the potential of the output terminal OUT is limited to the center voltage by the resistor R13. That is, whether or not muting is effected, the potential of the output terminal OUT is set at the half of the supply voltage. Accordingly, no pop noise is created for a load which is connected to the output terminal OUT.

Figure 3:
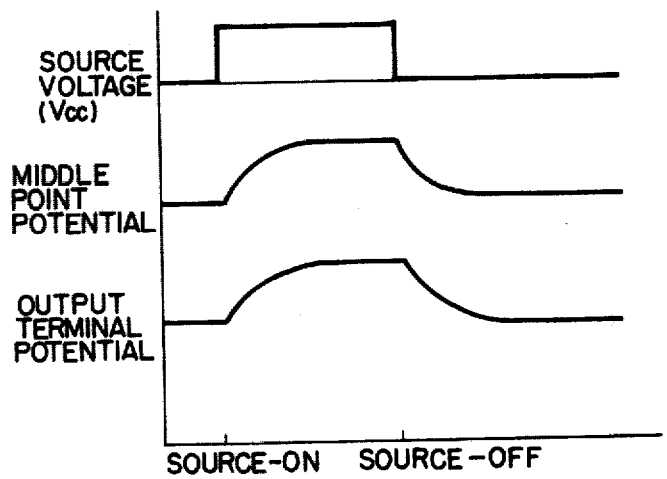
FIG. 3 is a set of waveforms illustrating characteristics of the circuit at the time of a muting-off operation.

In FIG. 3 are shown a series of waveforms illustrating characteristics which are obtained when the power source voltage applied to the switching circuit according to the invention shown in FIG. 1 is switched on and off. That is, when the power source is turned on, the supply voltage Vcc rises abruptly as shown in FIG. 3. However, the potential at the connection point of the resistors R10 and R11, that is the middle point potential, rises more slowly as shown in FIG. 3 while the potential of the output terminal OUT rises through the resistor R13 similar to the middle point potential. When the source is turned off, the source voltage Vcc falls quickly. However, the middle point potential falls slowly by virtue of the time constant of the resistor R11 and the capacitor C1, and the potential at the output terminal OUT falls similarly slowly. Accordingly, even if the power source were to be turned on or off, the potential of the output terminal OUT would never change abruptly. That is, no pop noise is created upon turning on and off the power source.

As is clear from the above description, the switching circuit according to the invention prevents the generation of pop noise which otherwise may be caused at the time of a muting on-off operation or power source on-off operation. The circuit produces less distortion and possesses a high supply voltage utilization factor. Accordingly, the dynamic range is increased and the output impedance is made very low. Therefore, the signal is hardly at all affected by the characteristics of a connecting line to the following state so that deterioration of the tone quality can be minimized.

What is claimed is:

1. In a single-ended push-pull circuit in which the emitters of a PNP transistor and an NPN transistor are commonly connected, the same signal is applied to the bases of said two transistors, and an output is provided at the commonly-connected emitters of said two transistors, the improvement comprising: a switching circuit in which a bias current applied to said two transistors is turned on and off by a current mirror circuit, and a resistor is connected between said commonly-connected emitters providing said output and a source of middle point potential so that when said two transistors are rendered nonconductive, the potential of said commonly-connected emitters of said two transistors is made equal to said middle point potential.

2. The circuit of claim 1 further comprising a capacitor coupled between said source of said middle point potential and ground.

3. The circuit of claim 1, further comprising a series connection of first and second diodes between the bases of said two transistors, each of said first and second diodes having an anode and a cathode, the anode of said first diode being coupled to the base of said NPN transistor and the cathode of said second diode being coupled to the base of said PNP transistor, with said same signal being applied to the common connection point of the two diodes.

4. A muting switching circuit comprising in combination:
 a first NPN transistor having its collector coupled to a positive terminal of a DC power source;
 a first PNP transistor having its emitter coupled to the emitter of said first NPN transistor and its collector coupled to a ground terminal of said power source;
 first and second diodes coupled in series with one another, the anode of said first diode being coupled to the base of said first NPN transistor and the cathode of said second diode being coupled to the base of said first PNP transistor;
 a second PNP transistor having its emitter coupled through a first resistor to said positive terminal and its collector coupled to said base of said first NPN transistor;
 a third PNP transistor having its base coupled to the base of said second PNP transistor and its emitter coupled through a second resistor to said positive terminal;
 a fourth PNP transistor having its emitter coupled to the bases of said second and third transistors, its collector coupled to ground and its base coupled to the collector of said third PNP transistor;
 a second NPN transistor having is collector coupled to the base of said first NPN transistor and its emitter coupled to ground through a third resistor;
 a third NPN transistor having its base coupled to the base of said second NPN transistor, its collector coupled to the collector of said third PNP transistor and its emitter coupled to ground through a fourth resistor, the intercoupled bases of said second and third NPN transistors forming a control signal input terminal;
 fifth and sixth resistors coupled in series with one another between said positive terminal and ground, said fifth and sixth resistors having substantially the same resistance values;
 a seventh resistor having one terminal coupled to the common connection point of said fifth and sixth resistor and a second terminal coupled to the intercoupled emitters of said first NPN transistor and said first PNP transistor; and
 a capacitor coupled between said common connection point of said fifth and sixth resistors and ground.

5. The muting switching circuit of claim 4 further comprising means for coupling an input signal to the common connection point of said first and second diodes.

6. A muting switching circuit comprising in combination:
 a push-pull transistor pair, including an NPN transistor and a PNP transistor each having a base, connected between two terminals of a power source;
 a current mirror circuit for supplying bias to said transistor pair in response to an input control signal thereto;
 means for supplying a middle point potential relative to said power source to a common connection point of said transistor pair;
 a series connection of first and second diodes connected between the bases of said transistors, each of said first and second diodes having an anode and a cathode, the anode of said first diode being coupled to the base of said NPN transistor and the cathode of said second diode being coupled to the base of said PNP transistor; and
 means for supplying at least a portion of an input signal to the common connection point of said two diodes.

* * * * *